United States Patent
Kamiya et al.

(10) Patent No.: US 12,471,280 B2
(45) Date of Patent: Nov. 11, 2025

(54) METHOD OF MANUFACTURING A SEMICONDUCTOR DEVICE WITH SELECTIVELY FORMED NITRIDE FILM

(71) Applicant: Kioxia Corporation, Tokyo (JP)

(72) Inventors: Yuta Kamiya, Nagoya Aichi (JP); Kenichiro Toratani, Yokkaichi Mie (JP); Kazuhiro Matsuo, Kuwana Mie (JP); Shoji Honda, Kuwana Mie (JP); Takuya Hirohashi, Ebina Kanagawa (JP); Borong Chen, Kawasaki Kanagawa (JP); Kota Takahashi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 648 days.

(21) Appl. No.: 17/844,585

(22) Filed: Jun. 20, 2022

(65) Prior Publication Data
US 2023/0309301 A1    Sep. 28, 2023

(30) Foreign Application Priority Data
Mar. 22, 2022  (JP) ................. 2022-045980

(51) Int. Cl.
*H10B 43/27*    (2023.01)
(52) U.S. Cl.
CPC .................... *H10B 43/27* (2023.02)
(58) Field of Classification Search
CPC ............ H01L 21/02; H01L 21/02008; H01L 21/0201; H01L 21/02019; H01L 21/02041; H01L 21/02043; H01L 21/311; H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10;
(Continued)

(56) References Cited

U.S. PATENT DOCUMENTS 6,294,448 B1 * 9/2001 Chang ............... H01L 21/28518
                                                     438/682
11,158,501 B2   10/2021 Nakatani
(Continued)

FOREIGN PATENT DOCUMENTS

| JP | 2020155607 A | 9/2020 |
|---|---|---|
| WO | 2020016915 A1 | 1/2020 |

*Primary Examiner* — William B Partridge
*Assistant Examiner* — Gustavo G Ramallo
(74) *Attorney, Agent, or Firm* — Holtz, Holtz & Volek PC

(57) ABSTRACT

A method of manufacturing a semiconductor device includes forming a first film including oxygen, forming a second film including nitrogen, etching surfaces of the first film and the second film using a substance including a halogen, and forming a third film including nitrogen on the surfaces of the first film and the second film. The third film is formed by alternately performing first processes and second processes, with each of the first processes forming a portion of the third film, and each of the second processes etching a portion of the third film using a substance including a halogen.

15 Claims, 16 Drawing Sheets

(58) Field of Classification Search
CPC ........ H10B 51/20; H10B 51/30; H10B 51/40; H10B 51/50
See application file for complete search history.

(56) References Cited

U.S. PATENT DOCUMENTS

| | | |
|---|---|---|
| 11,335,554 B2 | 5/2022 | Nakagawa et al. |
| 2012/0001345 A1* | 1/2012 | Park .................. H10D 30/0411 |
| | | 257/E21.597 |
| 2018/0033608 A1* | 2/2018 | Miyahara ............ C23C 16/0236 |
| 2018/0114794 A1* | 4/2018 | Jang ..................... H10D 64/037 |
| 2018/0158699 A1* | 6/2018 | Kitayama ................. B08B 5/00 |
| 2021/0035801 A1 | 2/2021 | Waseda et al. |
| 2021/0083064 A1* | 3/2021 | Okada .................... H10B 43/30 |
| 2021/0098254 A1* | 4/2021 | Takagi .................... C23C 16/24 |
| 2021/0143001 A1* | 5/2021 | Ashihara ............. H01L 21/0206 |
| 2021/0272803 A1 | 9/2021 | Nakatani et al. |
| 2021/0305043 A1 | 9/2021 | Nakatani et al. |

\* cited by examiner

METHOD OF MANUFACTURING A SEMICONDUCTOR DEVICE WITH SELECTIVELY FORMED NITRIDE FILM

CROSS REFERENCE TO RELATED APPLICATION

This application is based upon and claims the benefit of priority from the prior Japanese Patent Application No. 2022-045980, filed on Mar. 22, 2022, the entire contents of which are incorporated herein by reference.

FIELD

Embodiments described herein relate to a semiconductor device and a method of manufacturing the same.

BACKGROUND

In forming a second nitride film on a surface of an oxide film and a first nitride film, it may be desired to selectively form the second nitride film on the surface of the first nitride film.

DETAILED DESCRIPTION

Figure 1A:
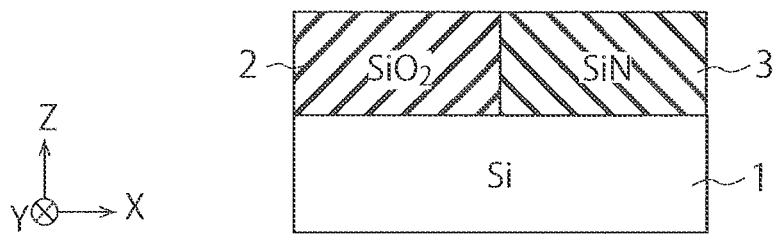
FIGS. 1A to 2C are cross-sectional views for explaining a method of manufacturing a semiconductor device of a first embodiment.

Embodiments will now be explained with reference to the accompanying drawings. In FIGS. 1A to 16, the same configurations are designated by the same reference numerals and characters, and duplicate description will be omitted.

In one embodiment, a method of manufacturing a semiconductor device includes forming a first film including oxygen. The method further includes forming a second film including nitrogen. The method further includes etching surfaces of the first film and the second film using a substance including a halogen. The method further includes forming a third film including nitrogen on the surfaces of the first film and the second film. The third film is formed by alternately performing first processes and second processes, wherein each of the first processes forms a portion of the third film, and each of the second processes etches a portion of the third film using a substance including a halogen.

First Embodiment

FIGS. 1A to 2C are cross-sectional views for explaining a method of manufacturing a semiconductor device of a first embodiment.

First, an oxide film 2 and a nitride film 3 are formed on a substrate 1 (FIG. 1A). The substrate 1 is, for example, a semiconductor substrate such as a Si (silicon) substrate. FIG. 1A shows X and Y directions parallel to a surface of the substrate 1 and perpendicular to each other, and Z direction perpendicular to the surface of the substrate 1. The X, Y, and Z directions intersect with each other. In the present specification, the +Z direction is used to be an upward direction, and the −Z direction is used to be a downward direction. The −Z direction may be or may not be the same as the gravity direction.

The oxide film 2 is, for example, a $SiO_2$ film (silicon oxide film). The oxide film 2 may further include atoms other than Si and O. Further, the composition ratio of Si and O in the oxide film 2 is not limited to 1:2, and may be any other ratio. The oxide film 2 is formed, for example, on the substrate 1 by CVD (Chemical Vapor Deposition). The oxide film 2 is an example of the first film.

The nitride film 3 is, for example, a SiN film (silicon nitride film). The nitride film 3 may further include atoms other than Si and N. Further, the composition ratio of Si and N in the nitride film 3 is not limited to 1:1 and may be any other ratio. The nitrogen concentration in the nitride film 3 is higher than the nitrogen concentration in the oxide film 2. The nitride film 3 is formed, for example, on the substrate 1 by CVD. The nitride film 3 is an example of the second film.

The oxide film 2 and the nitride film 3 may be formed directly on the substrate 1 or may be formed on the substrate 1 via another film. Further, the oxide film 2 may be formed before the formation of the nitride film 3 or may be formed after the formation of the nitride film 3. Further, although the oxide film 2 and the nitride film 3 are adjacent to each other in the X direction in FIG. 1A, they may be adjacent to each other in another direction (for example, the Z direction).

Figure 1B:
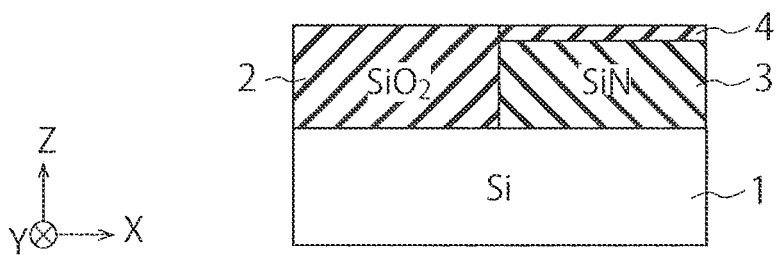

After that, a natural oxide film 4 is formed on the surface of the nitride film 3 (FIG. 1B). The natural oxide film 4 is, for example, a $SiO_2$ film. In FIG. 1B, a portion of the nitride film 3 changes to the natural oxide film 4 by natural oxidation. The natural oxide film 4 is formed, for example, by carrying the substrate 1 from the inside to the outside of a chamber of a semiconductor manufacturing apparatus (for example, a CVD apparatus).

Figure 1C:
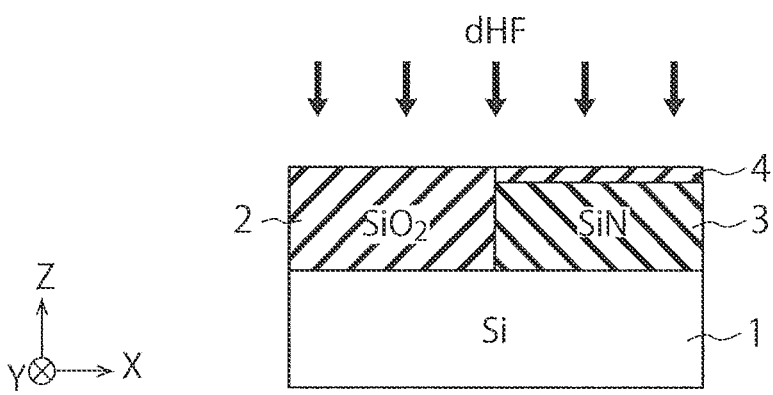

Next, the natural oxide film 4 is removed by wet etching (FIG. 1C). This wet etching is performed using, for example, a dHF (dilute hydrofluoric acid) aqueous solution. This dHF aqueous solution is an example of the substance including a halogen. The step of FIG. 1C may be performed by dry etching using a substance including a halogen.

Figure 2A:
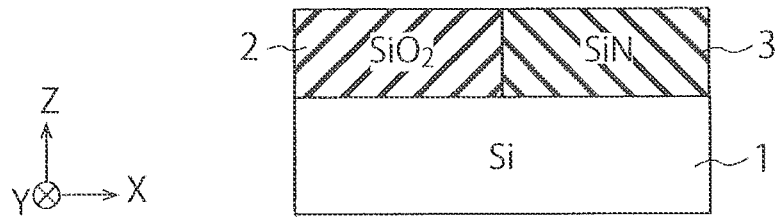

In the step of FIG. 1C, the surfaces of the oxide film 2 and the nitride film 3 are also etched, and a portion of the oxide film 2 and the nitride film 3 is also removed (FIG. 2A). Further, F atoms derived from the dHF aqueous solution are added to the surfaces of the oxide film 2 and the nitride film 3. At this time, the concentration of F atoms on the surface of the nitride film 3 is higher than the concentration of F atoms on the surface of the oxide film 2. Details of such a phenomenon will be described later. The surfaces of the oxide film 2 and the nitride film 3 may be further processed with IPA (isopropyl alcohol).

Figure 2B:
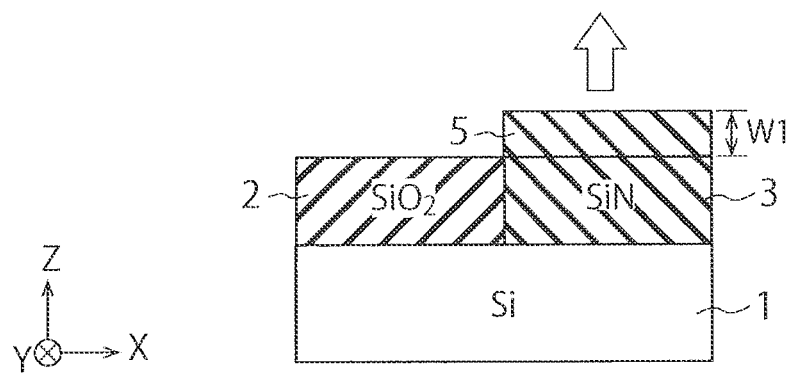
Figure 2C:
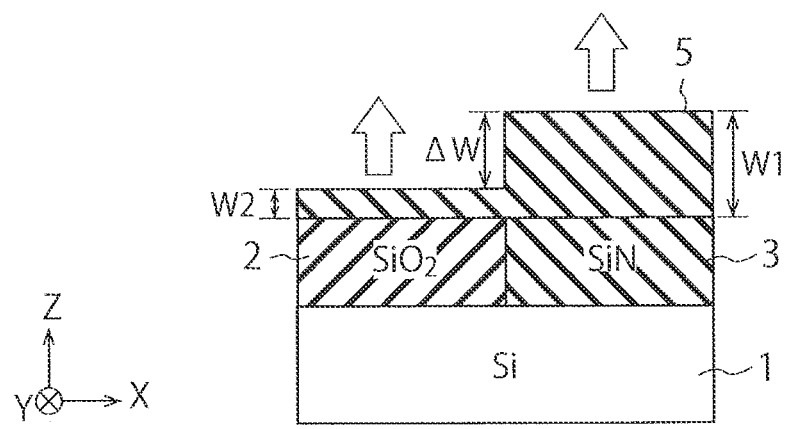

Next, the nitride film 5 is formed on the entire surface of the substrate 1 (FIG. 2B). As a result, the nitride film 5 is formed on the surface of the nitride film 3 (FIG. 2B), and further, the nitride film 5 is also formed on the surface of the oxide film 2 (FIG. 2C). FIGS. 2B and 2C show a thickness W1 of the nitride film 5 formed on the nitride film 3, a thickness W2 of the nitride film 5 formed on the oxide film 2, and ΔW (ΔW=W1−W2), which is a difference between thickness W1 and thickness W2. This difference ΔW is also called an incubation difference.

The nitride film 5 is, for example, a SiN film. The nitride film 5 may further include atoms other than Si and N. Further, the composition ratio of Si and N in the nitride film 5 is not limited to 1:1 and may be any other ratio. The nitride film 5 is formed on the oxide film 2 and the nitride film 3, for example, by CVD. This CVD is, for example, ALD (Atomic Layer Deposition). The nitride film 5 of the present embodiment is formed by using, for example, $SiH_2Cl_2$ (dichlorosilane) gas, which is a Si source gas, and $NH_3$ (ammonia) gas, which is an N source gas. The nitride film 5 and the nitride film 6 described later are examples of the third film.

In the present embodiment, the F atom added to the surface of the oxide film 2 and the nitride film 3 promotes the formation of the nitride film 5. As described above, the concentration of F atoms on the surface of the nitride film 3 is higher than the concentration of F atoms on the surface of the oxide film 2. Therefore, the nitride film 5 begins to be formed from the surface of the nitride film 3 (FIG. 2B), and subsequently starts to be formed from the surface of the oxide film 2 (FIG. 2C). As a result, the thickness W1 of the nitride film 5 on the nitride film 3 is thicker than the thickness W2 of the nitride film 5 on the oxide film 2 (FIG. 2C). Details of such a phenomenon will be described later.

Figure 3:
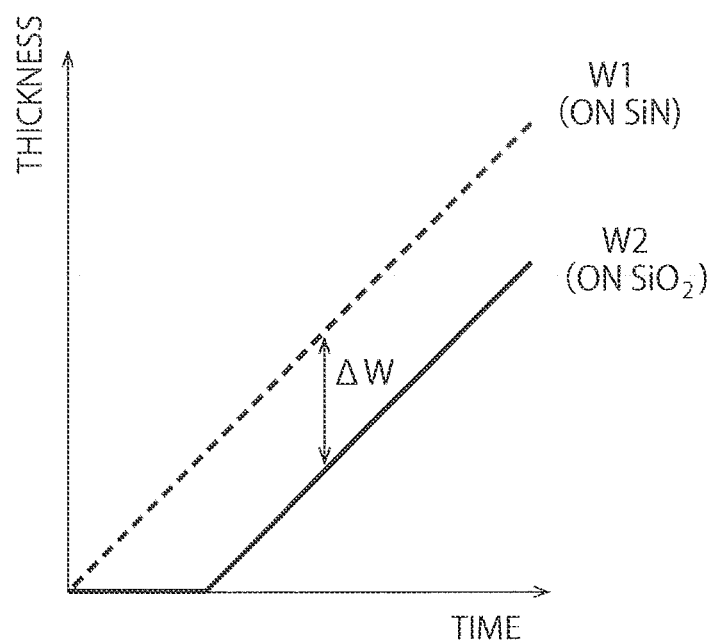
FIG. 3 is a graph for explaining the method of manufacturing the semiconductor device of the first embodiment.

FIG. 3 is a graph for explaining the method of manufacturing the semiconductor device of the first embodiment.

The horizontal axis of FIG. 3 represents the elapsed time in the steps of FIGS. 2B and 2C. The vertical axis of FIG. 3 shows the thicknesses W1 and W2 of the nitride film 5 in the steps of FIGS. 2B and 2C. In the present embodiment, the thicknesses W1 and W2 increase at the same rate as shown in FIG. 3. However, the nitride film 5 of the present embodiment begins to be formed from the surface of the nitride film 3 (FIG. 2B), and subsequently starts to be formed from the surface of the oxide film 2 (FIG. 2C). Therefore, in FIG. 3, the straight line representing the thickness W2 is located below the straight line representing the thickness W1. The thicknesses W1 and W2 increase at the same rate, so that the difference ΔW between the thicknesses W1 and W2 is constant regardless of time.

Figure 4:
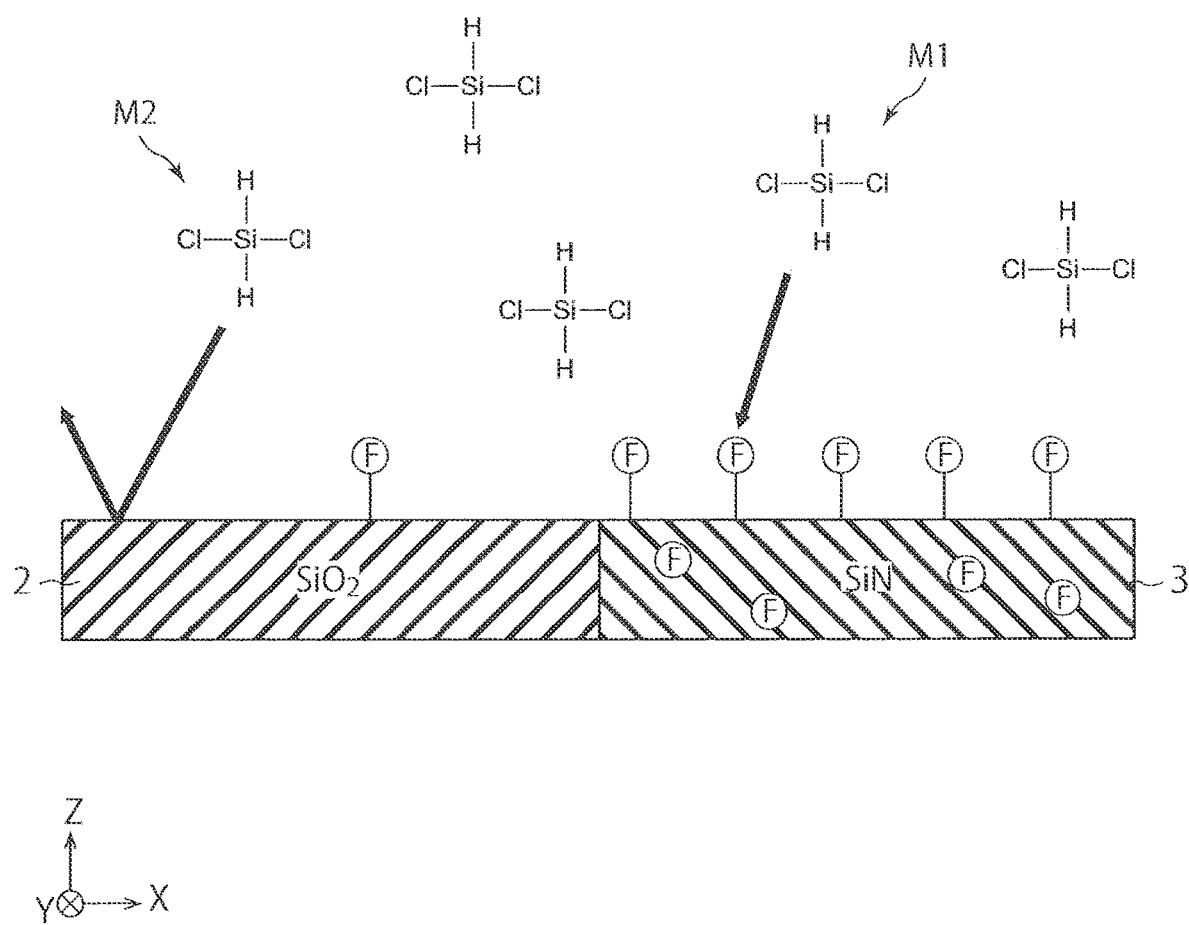
FIG. 4 is an enlarged cross-sectional view for explaining the method of manufacturing the semiconductor device of the first embodiment.

FIG. 4 is an enlarged cross-sectional view for explaining the method of manufacturing the semiconductor device of the first embodiment.

FIG. 4 shows the F atoms added to the oxide film 2 and the nitride film 3. When wet etching is performed in the step of FIG. 1C, F atoms derived from the dHF aqueous solution are added to the surface and the inside of the oxide film 2 and the nitride film 3. The F atoms added to the surface of the oxide film 2 or the nitride film 3 becomes reactive groups when forming the nitride film 5. F atoms are more likely to be added to the nitride film 3 than the oxide film 2, so that the concentration of F atoms on the surface of the nitride film 3 is higher than the concentration of F atoms on the surface of the oxide film 2, as shown in FIG. 4.

FIG. 4 further shows $SiH_2Cl_2$ molecules. In the present embodiment, the $SiH_2Cl_2$ molecule reacts with the F atom on the surface of the oxide film 2 and the nitride film 3 in the steps of FIGS. 2B and 2C to form the nitride film 5. At this time, the H atoms in the $SiH_2Cl_2$ molecules desorb the F atoms from the surface of the oxide film 2 and the nitride film 3.

FIG. 4 further shows a $SiH_2Cl_2$ molecule "M1" toward the surface of the nitride film 3 and a $SiH_2Cl_2$ molecule "M2" toward the surface of the nitride film 3. In the present embodiment, the concentration of F atoms on the surface of the nitride film 3 is higher than the concentration of F atoms on the surface of the oxide film 2. Therefore, the $SiH_2Cl_2$ molecule "M1" is likely to approaches the F atom on the surface of the nitride film 3, but the $SiH_2Cl_2$ molecule "M2" is unlikely to approach the F atom on the surface of the oxide film 2. As a result, the nitride film 5 begins to be formed from the surface of the nitride film 3 (FIG. 2B) and subsequently from the surface of the oxide film 2 (FIG. 2C).

When the nitride film 5 begins to be formed on the surface of the oxide film 2, both the surface of the nitride film 3 and the surface of the oxide film 2 are covered with the nitride film 5. Therefore, the nitride film is likely to be formed on the oxide film 2 to the same extent that the nitride film 5 is likely to be formed on the nitride film 3. As a result, the thicknesses W1 and W2 to increase at the same rate (FIG. 3).

When the pressure for forming the nitride film 5 becomes low, the difference ΔW between the thickness W1 and the thickness W2 becomes large. The reason is that this low pressure makes $SiH_2Cl_2$ molecules less likely to collide with the surfaces of the oxide film 2 and the nitride film 3, and this promotes the formation of the nitride film 5 more on the surface of the nitride film 3 than on the surface of the oxide film 2. This pressure is preferably 50 Pa or less, for example. This pressure is, for example, a pressure in a chamber of a semiconductor manufacturing apparatus (for example, the ALD apparatus) in which the substrate 1 is accommodated when the nitride film 5 is formed.

In the steps of FIGS. 2B and 2C, the nitride film 5 is formed not only on the surface of the nitride film 3 but also on the surface of the oxide film 2. Therefore, when it is desired to selectively form the nitride film 5 on the surface of the nitride film 3, it is necessary to end the formation of the nitride film 5 before the nitride film 5 is formed on the surface of the oxide film 2. However, when the formation of the nitride film 5 ends in this way, it is difficult to form the nitride film 5 having a thick thickness.

Therefore, it is desirable that the nitride film 5 (and the nitride film 6) of the present embodiment be formed by a method shown in FIGS. 5A to 6C. Specifically, the nitride film 5 (and the nitride film 6) are each formed in the steps of FIGS. 5A to 6C instead of the steps of FIGS. 2B and 2C.

FIGS. 5A to 6C are cross-sectional views showing a method of manufacturing the semiconductor device of the first embodiment.

Figure 5A:
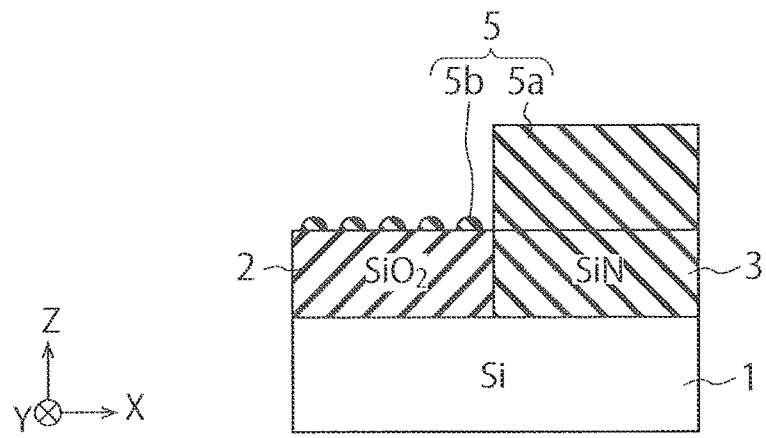
FIGS. 5A to 6C are cross-sectional views showing the method of manufacturing the semiconductor device of the first embodiment.

First, after the steps of FIGS. 1A and 2A are carried out, the nitride film 5 is formed on the entire surface of the substrate 1 (FIG. 5A). As a result, the nitride film 5 is formed on the surface of the nitride film 3, and further the nitride film 5 begins to be formed on the surface of the oxide film 2. The nitride film 5 shown in FIG. 5A includes a portion 5a formed on the nitride film 3 and a portion 5b formed on the oxide film 2. The step of FIG. 5A ends when the portion 5b begins to be formed. Hereinafter, the step of FIG. 5A is also referred to as a "forming process". This forming process is an example of a first process.

As described above, the nitride film 5 is, for example, a SiN film. The nitride film 5 may further include atoms other than Si and N. Further, the composition ratio of Si and N in the nitride film 5 is not limited to 1:1 and may be any other ratio. The nitride film 5 is formed on the oxide film 2 and the nitride film 3, for example, by CVD. This CVD is, for example, ALD. The nitride film 5 of the present embodiment is formed by using, for example, $SiH_2Cl_2$ gas, which is a Si source gas, and $NH_3$ gas, which is an N source gas. The nitride film 5 and the nitride film 6 described later are examples of the third film.

Figure 5B:
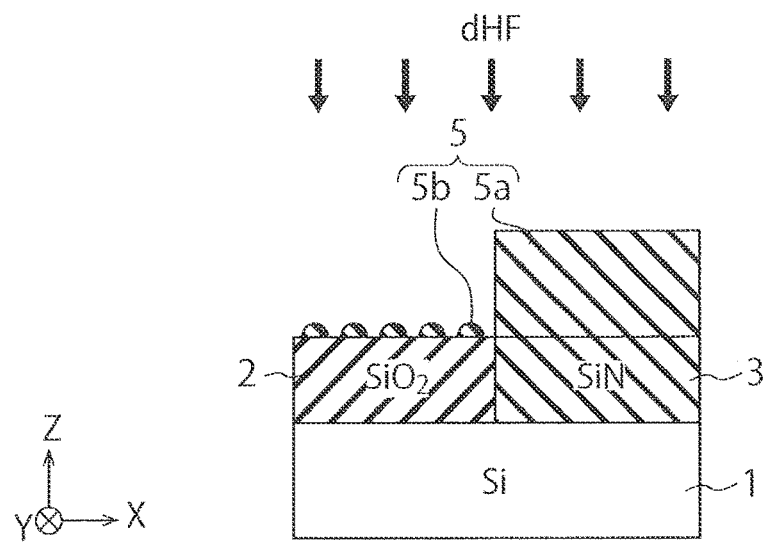

Next, a portion of the nitride film 5 is removed by wet etching (FIG. 5B). This wet etching is performed using, for example, a dHF aqueous solution. This dHF aqueous solution is an example of the substance including a halogen. The step of FIG. 5B may be performed by dry etching using a substance including a halogen. Hereinafter, the step of FIG. 5B is also referred to as "etching process". This etching process is an example of a second process.

Figure 5C:
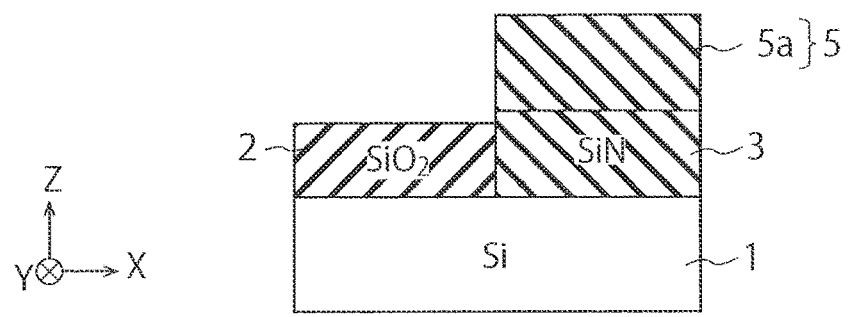

In the step of FIG. 5B, the portion 5b of the nitride film 5 is removed, and the portion 5a of the nitride film 5 is also partially removed (FIG. 5C). As a result, the surface of the oxide film 2 and the portion 5a is also etched, and a portion of the oxide film 2 and the portion 5a is also removed. Furthermore, F atoms derived from the dHF aqueous solution are added to the surfaces of the oxide film 2 and the portion 5a. At this time, the concentration of F atoms on the surface of the portion 5a is higher than the concentration of F atoms on the surface of the oxide film 2 for the above-described reason.

According to the present embodiment, the forming process and etching process make it possible to selectively form the nitride film 5 (portion 5a) on the surface of the nitride film 3. However, the thickness of the nitride film 5 formed by the above-described forming process and etching process is about the same as the thickness of the nitride film 5 formed in the steps of FIGS. 2B and 2C. Therefore, in the present embodiment, the forming processes and etching processes are alternately repeated. This makes it possible to selectively form "a nitride film having a thick thickness" on the surface of the nitride film 3. In other words, this makes it possible to increase the "difference" between the thickness of the nitride film formed on the surface of the nitride film 3 and the thickness of the nitride film formed on the surface of the oxide film 2. The thickness of the nitride film 5 shown in FIG. 5C is, for example, less than 4 nm.

Figure 6A:
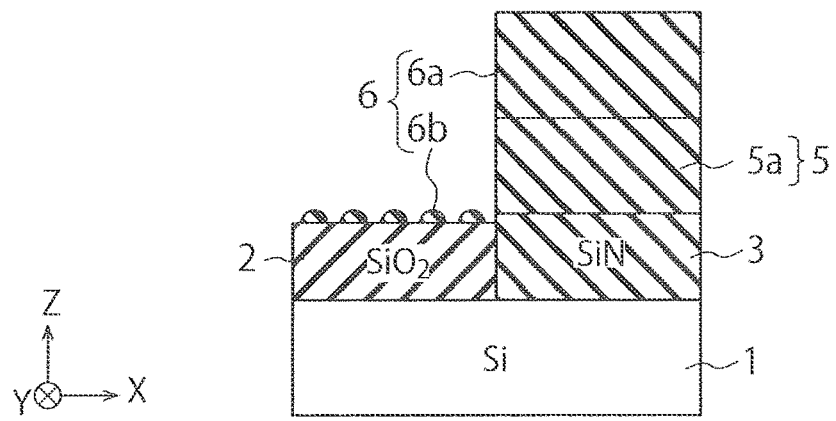

Next, the nitride film 6 is formed on the entire surface of the substrate 1 (FIG. 6A). As a result, the nitride film 6 is formed on the surface of the nitride film 5, and further, the nitride film 6 begins to be formed on the surface of the oxide film 2. The nitride film 6 shown in FIG. 6A includes a portion 6a formed on the nitride film 5 and a portion 6b formed on the oxide film 2. The step of FIG. 6A ends when the portion 6b begins to be formed. Whereas the step of FIG. 5A is the "first forming process", the step of FIG. 6A is the "second forming process".

The details of the nitride film 6 are the same as those of the nitride film 5. The nitride film 6 is, for example, a SiN film. The nitride film 6 may further include atoms other than Si and N. Further, the composition ratio of Si and N in the nitride film 6 is not limited to 1:1 and may be any other ratio. The nitride film 6 is formed on the oxide film 2 and the nitride film 5, for example, by CVD. This CVD is, for example, ALD. The nitride film 6 of the present embodiment is formed by using, for example, $SiH_2Cl_2$ gas, which is a Si source gas, and $NH_3$ gas, which is an N source gas. The nitride film 6 and the above-described nitride film 5 are examples of the third film.

Figure 6B:
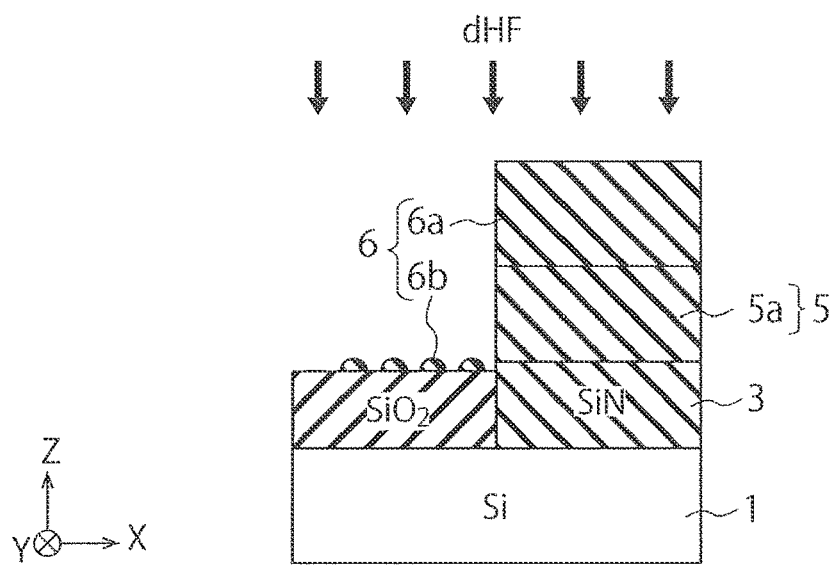

Next, a portion of the nitride film 5 is removed by wet etching (FIG. 6B). This wet etching is performed using, for example, a dHF aqueous solution. This dHF aqueous solution is an example of the substance including a halogen. The step of FIG. 6B may be performed by dry etching using a substance including a halogen. Whereas the step of FIG. 5B is the "first etching process", the step of FIG. 6B is the "second etching process".

Figure 6C:
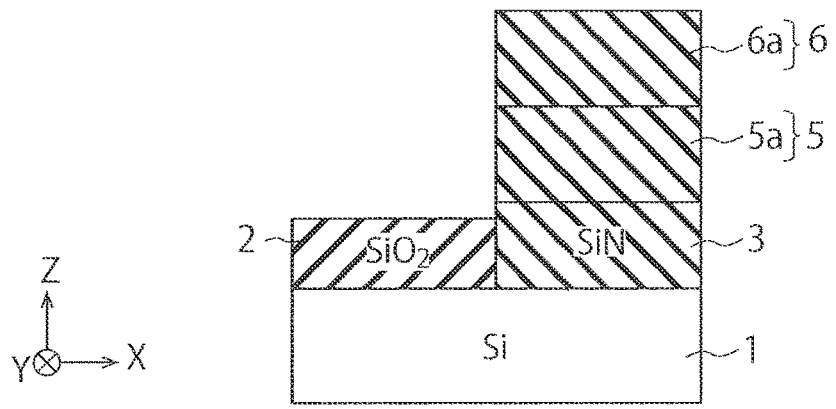

In the step of FIG. 6B, the portion 6b, which is the nitride film 6, is removed, and the portion 6a, which is the nitride film 6, is also partially removed (FIG. 6C). As a result, the surface of the oxide film 2 and the portion 6a are also etched, and a portion of the oxide film 2 and the portion 6a is also removed. Further, F atoms derived from the dHF aqueous solution are added to the surfaces of the oxide film 2 and the portion 6a. At this time, the concentration of F atoms on the surface of the portion 6a is higher than the concentration of F atoms on the surface of the oxide film 2 for the above-described reason.

According to the present embodiment, alternately repeating the forming processes and etching processes makes it possible to selectively form a thick nitride films 5 and 6 (portions 5a and 6a) each having a thick thickness on the surface of the nitride film 3. In the present embodiment, two forming processes and the two etching processes are alternately performed, but three or more forming processes and three or more etching processes may be alternately performed. This makes it possible to selectively form a nitride film having a thicker thickness on the surface of the nitride film 3. The total thickness of the nitride films 5 and 6 shown in FIG. 6C is, for example, 4 nm or more.

After that, various devices, interconnect layers, plugs, pads, inter layer dielectrics, etc. are formed on the substrate 1. In this way, the semiconductor device of the present embodiment is manufactured.

Figure 7:
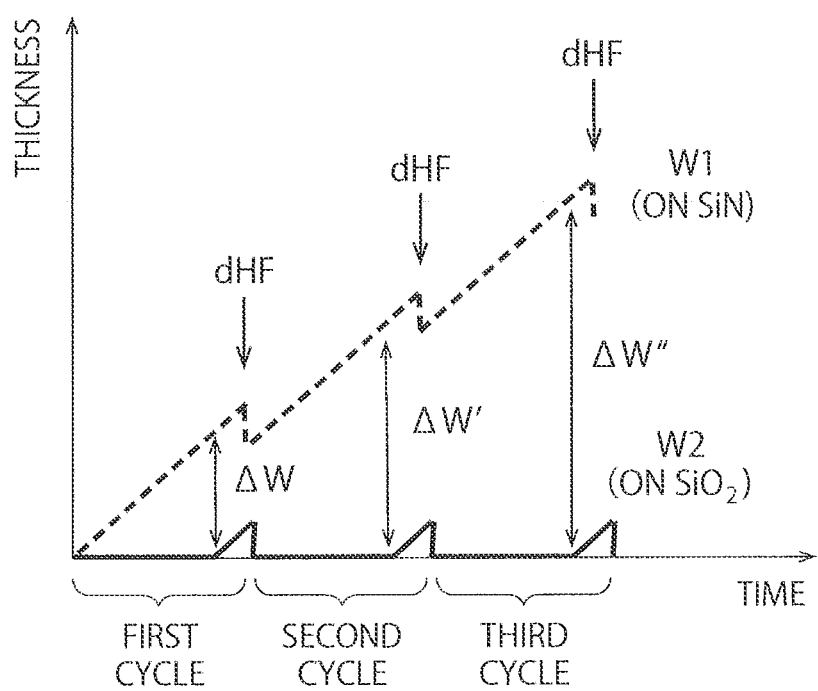
FIG. 7 is a graph for explaining the method of manufacturing the semiconductor device of the first embodiment.

FIG. 7 is a graph for explaining the method of manufacturing the semiconductor device of the first embodiment.

The horizontal axis of FIG. 7 represents the elapsed time in the steps of FIGS. 5A to 6C. The first cycle represents the first forming process and the first etching process (FIGS. 5A to 5C). The second cycle represents a second forming process and a second etching process (FIGS. 6A to 6C). The third cycle represents a third forming process and a third etching process. The vertical axis of FIG. 7 shows the thicknesses W1 and W2 in the steps of FIGS. 5A to 6C. The thickness W1 represents the thickness of the nitride films (portions 5a and 6a of the nitride films 5 and 6) on the nitride film 3. The thickness W2 represents the thickness of the nitride films (portions 5b and 6b of the nitride films 5 and 6) on the oxide film 2.

At the end of the first cycle, the thickness W2 increases slightly from zero. This represents the thickness of the portion 5b shown in FIG. 5A. The portion 5b is removed by the first etching process, so that the thickness W2 in the first cycle subsequently returns to zero. The difference between the thickness W1 and the thickness W2 in the first cycle becomes ΔW as described above at the end of the first forming process.

At the end of the second cycle, the thickness W2 increases slightly from zero. This represents the thickness of the portion 6b shown in FIG. 6A. The portion 6b is removed by the second etching process, so that the thickness W2 in the second cycle is subsequently returns to zero. The difference between the thickness W1 and the thickness W2 in the second cycle becomes ΔW' that is larger than the above ΔW at the end of the second forming process. This corresponds to that the total thickness of the portions 5a and 6a is larger than the thickness of the portions 5a.

At the end of the third cycle, the thickness W2 increases slightly from zero. The details of the third cycle and subsequent cycles are the same as those of the second cycle. Therefore, the thickness W2 in the third cycle subsequently returns to zero. The difference between the thickness W1 and the thickness W2 in the third cycle becomes ΔW", which is larger than the above ΔW', at the end of the third forming process.

Figure 8:
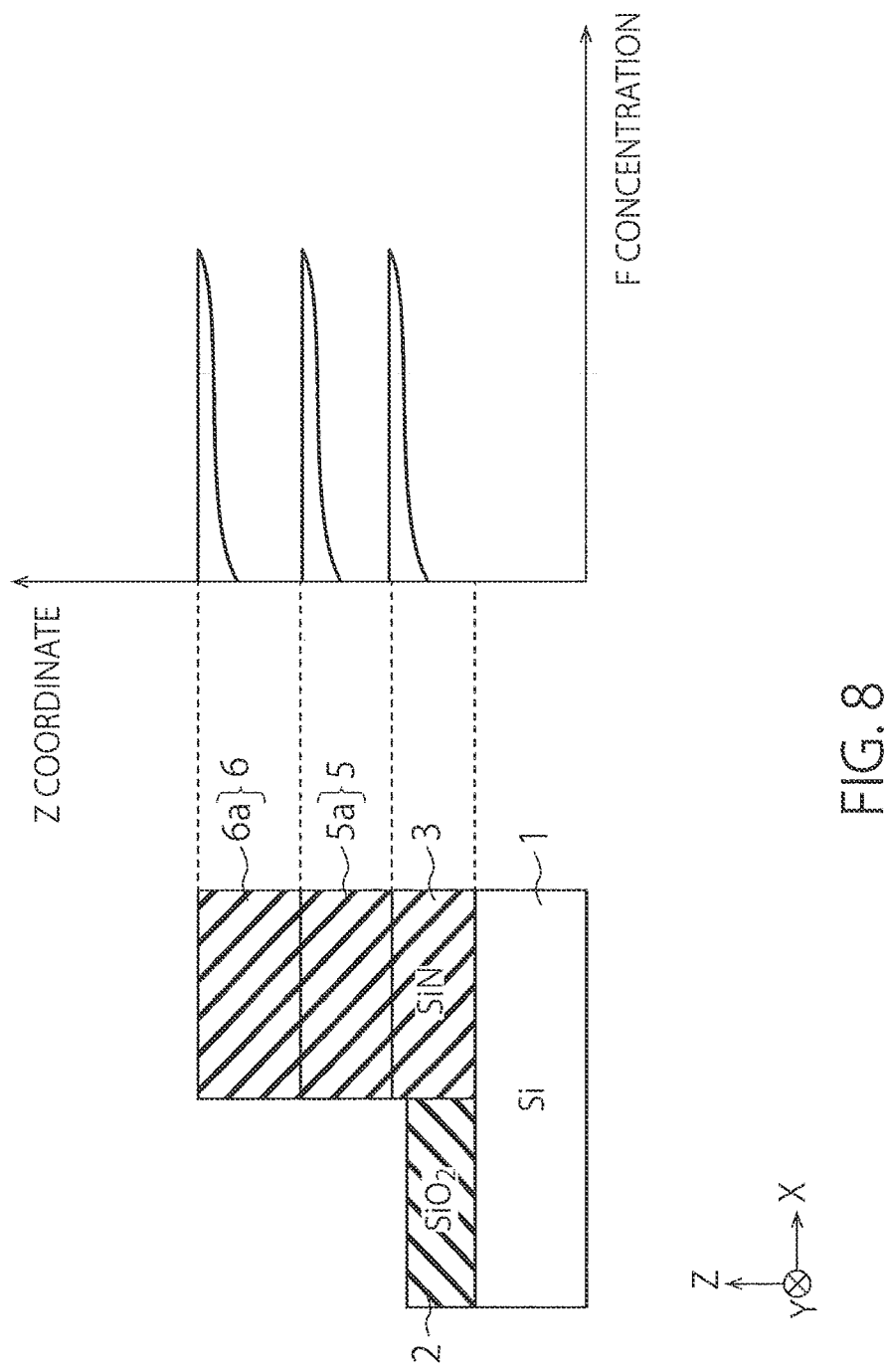
FIG. 8 is a graph and a cross-sectional view for explaining the method of manufacturing the semiconductor device of the first embodiment.

FIG. 8 is a graph and a cross-sectional view for explaining the method of manufacturing the semiconductor device of the first embodiment.

The cross-sectional view of FIG. 8 shows the same cross section as the cross section shown in FIG. 6C. The graph of FIG. 8 shows the F concentration distribution in the Z direction in the nitride films 3, 5 and 6. The Z direction corresponds to the thickness direction of the nitride films 3, 5 and 6. The Z direction of the present embodiment is an example of the first direction.

As described above, the step of FIG. 1C, the step of FIG. 5B, and the step of FIG. 6B are performed using the dHF aqueous solution. In these steps, F atoms derived from the dHF aqueous solution are added to the surfaces and the inside of the nitride films 3, 5 and 6. As a result, the F concentration distribution in the Z direction in the nitride films 3, 5 and 6 has a plurality of concentration peaks as shown in FIG. 8. These concentration peaks are formed near the surface of the nitride film 3, near the surface of the nitride film 5, and near the surface of the nitride film 6.

When the forming processes and etching processes are repeated N times (N is an integer of 2 or more), N+1 concentration peaks appear as these.

Next, with reference to FIGS. 5A to 6C again, further details of the forming processes and etching processes will be described. The following description regarding the etching processes is applicable to the etching in the step of FIG. 1C.

The forming processes may use a Si source gas other than $SiH_2Cl_2$ gas, or may use an N source gas other than $NH_3$ gas. The Si source gas may include, for example, an inorganic compound gas such as $SiH_4$ gas, $SiH_3Cl$ gas, and $SiHCl_3$ gas (Si represents silicon, H represents hydrogen, and Cl represents chlorine). The N source gas may include, for example, a nitriding agent gas such as $N_2H_4$ (N represents nitrogen and H represents hydrogen). The Si source gas is an example of the first gas, and the N source gas is an example of the second gas. The forming processes of the present embodiment are desirably performed at 50 Pa or less. This makes it possible to promote the formation of the nitride films 5 and 6.

The etching processes may use an etching solution other than the dHF aqueous solution, or may use an etching gas instead of the etching solution. The etching processes of the present embodiment may be wet etching or dry etching as long as the above-described halogen can be added. The etching solution or etching gas may include a halogen other than F (fluorine), and may include, for example, Cl (chlorine), Br (bromine), or I (iodine). The etching solution or etching gas may include, for example, $F_2$, HF, $NF_3$, $SiF_4$, or ClF (F represents fluorine, H represents hydrogen, N represents nitrogen, Si represents silicon, and Cl represents chlorine). According to the present embodiment, adding a halogen to the surface of the nitride film 3 or the like allows the nitride film 5 to be selectively formed on the surface of the nitride film 3. This also applies when halogen is added to the surfaces of the nitride films 5 and 6.

When the etching processes are performed using etching gas, the forming processes and the etching processes of the present embodiment has the step of supplying Si source gas and N source gas to the substrate 1 and the step of supplying the etching gas to the substrate 1, both repeated alternately. This makes it possible to alternately repeat the forming processes and the etching processes. In this case, it is desirable to perform a purging process of the chamber accommodating the substrate 1 between a forming process and an etching process.

As described above, in the present embodiment, when the nitride film including the nitride films 5 and 6 are formed on the surfaces of the oxide film 2 and the nitride film 3, these nitride films (5 and 6) are formed by alternately performing the forming processes each forms a portion of the nitride films (5 and 6), and the etching processes each etching a portion of these nitride films (5 and 6) using a substance including a halogen. Therefore, the present embodiment makes it possible to selectively form the nitride film (5 and 6). Specifically, the present embodiment makes it possible to selectively form the nitride films (5 and 6) on the surface of the nitride film 3 among the surfaces of the oxide film 2 and the nitride film 3.

Second Embodiment

Figure 9:
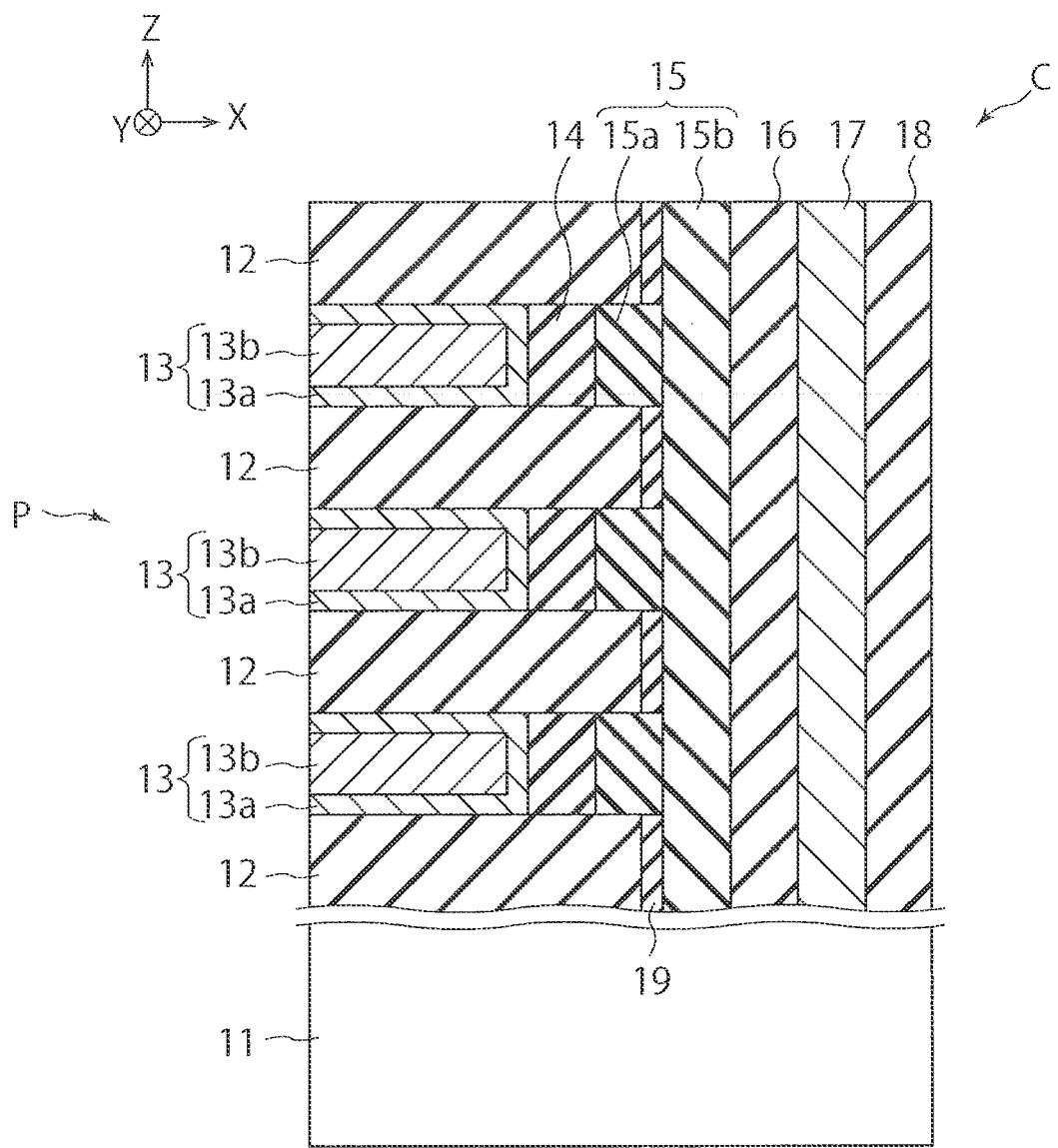
FIG. 9 is a cross-sectional view showing a structure of a semiconductor device of a second embodiment.

FIG. 9 is a cross-sectional view showing a structure of a semiconductor device of a second embodiment. The semiconductor device of the present embodiment includes, for example, a three-dimensional semiconductor memory. The semiconductor device of the present embodiment and the method of manufacturing the semiconductor device of the present embodiment correspond to an example of the semiconductor device of the first embodiment and the method of manufacturing the semiconductor device of the first embodiment.

The semiconductor device of the present embodiment includes: a substrate 11; a plurality of insulators 12; a plurality of electrode layers 13; a plurality of block insulators 14; a charge storage film 15; a tunnel insulator 16; a channel semiconductor layer 17; a core insulator 18; and a plurality of insulators 19. Each electrode layer 13 includes a barrier metal layer 13a and an electrode material layer 13b. The charge storage film 15 includes a plurality of outer peripheral films 15a and an inner peripheral film 15b. Each insulator 12 is an example of the first film. The inner peripheral film 15b is an example of the second film and a first portion. Each outer peripheral film 15a is an example of a third film and a second portion.

The substrate 11 is a semiconductor substrate such as a Si substrate. FIG. 9 shows the X and Y directions parallel to the surface of the substrate 11 and perpendicular to each other, and the Z direction perpendicular to the surface of the substrate 11. The substrate 11 of the present embodiment corresponds to the substrate 1 of the first embodiment.

The plurality of insulators 12 and the plurality of electrode layers 13 described above are alternately stacked on the substrate 11 to form a stacked film P. The stacked film P further includes block insulators 14 and an outer peripheral films 15a each provided in order on the side face of each electrode layer 13. In FIG. 9, the Z direction is the stacking direction of the stacked film P.

Each insulator 12 is, for example, a $SiO_2$ film. Each insulator 12 may further include atoms other than Si and O.

Each insulator 12 of the present embodiment corresponds to the oxide film 2 of the first embodiment.

Each electrode layer 13 includes a barrier metal layer 13a and an electrode material layer 13b formed in order between the insulators 12 adjacent to each other. The barrier metal layer 13a is, for example, a TiN (titanium nitride) layer. The electrode material layer 13b is, for example, a W (tungsten) layer. Each electrode layer 13 functions as, for example, a word line of a three-dimensional semiconductor memory.

Each block insulator 14 is provided on the side face of each electrode layer 13 in the stacked film P. Therefore, in the stacked film P, the plurality of insulators 12 and the plurality of block insulators 14 are alternately stacked in the Z direction. Each block insulator 14 is, for example, a $SiO_2$ film. Each block insulator 14 may include a metal insulator in place of the $SiO_2$ film or together with the $SiO_2$ film.

Each outer peripheral film 15a of the charge storage film 15 is provided on the side face of each block insulator 14 in the stacked film P. Therefore, in the stacked film P, the plurality of insulators 12 and the plurality of outer peripheral films 15a are alternately stacked in the Z direction. These outer peripheral films 15a are formed on the side face of the inner peripheral film 15b of the charge storage film 15 and are in contact with inner peripheral film 15b. Each outer peripheral film 15a is, for example, a SiN film. Each outer peripheral film 15a may further include atoms other than Si and N. Each outer peripheral film 15a of the present embodiment corresponds to the nitride films 5 and 6 of the first embodiment.

Each insulator 19 is formed on the side face of each insulator 12. In FIG. 9, the plurality of outer peripheral films 15a and the plurality of insulators 19 are alternately stacked in the Z direction. The insulators 19 are used as etching stoppers in performing a replacing step described later. Each insulator 19 is, for example, a $SiO_2$ films.

The inner peripheral film 15b of the charge storage film 15, the tunnel insulator 16, the channel semiconductor layer 17, and the core insulator 18 are sequentially formed in the stacked film P, and forms a columnar portion C having a columnar shape extending in the Z direction. Each block insulator 14, each outer peripheral film 15a of the charge storage film 15, and each insulator 19 have an annular shape surrounding the columnar portion C.

The inner peripheral film 15b of the charge storage film 15 is provided on the side face of the plurality of outer peripheral films 15a and the plurality of insulators 19. The inner peripheral films 15b and these outer peripheral films 15a form the charge storage film 15. The charge storage film 15 can store signal charges for a three-dimensional semiconductor memory. The inner peripheral film 15b is, for example, a SiN film. The inner peripheral film 15b may further include atoms other than Si and N. The inner peripheral film 15b of the present embodiment corresponds to the nitride film 3 of the first embodiment.

The tunnel insulator 16 is formed on the side face of the inner peripheral film 15b of the charge storage film 15. The tunnel insulator 16 is, for example, a $SiO_2$ film.

The channel semiconductor layer 17 is formed on the side face of the tunnel insulator 16. The channel semiconductor layer 17 is, for example, a polysilicon layer.

The core insulator 18 is formed on the side face of the channel semiconductor layer 17. The core insulator 18 is, for example, a 5102 film.

FIGS. 10A to 13B are cross-sectional views showing a method of manufacturing the semiconductor device of the second embodiment.

Figure 10B:
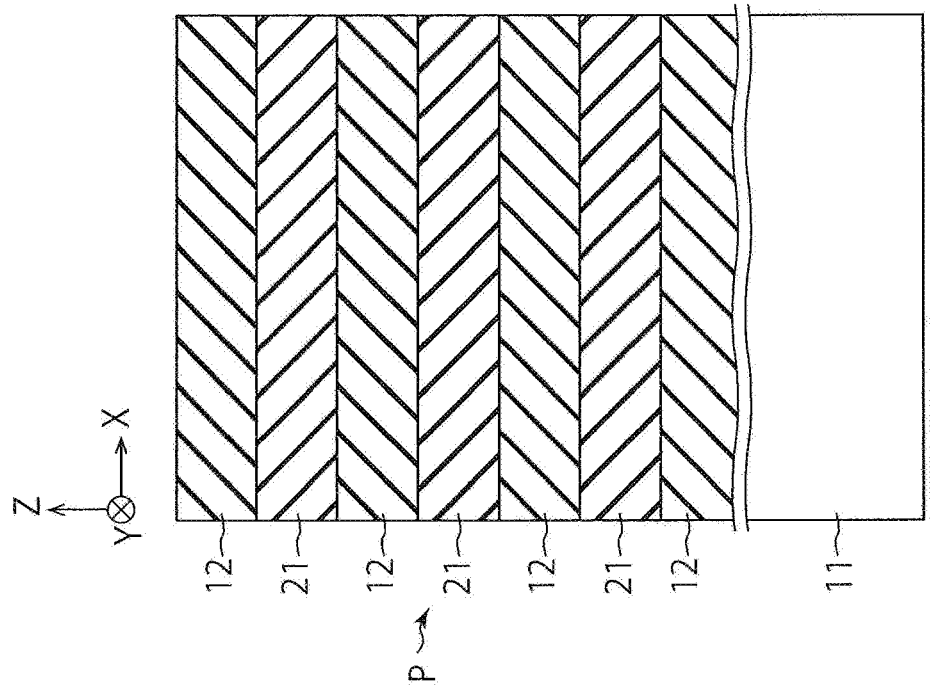
FIGS. 10A to 13B are cross-sectional views showing a method of manufacturing the semiconductor device of the second embodiment.
Figure 10A:
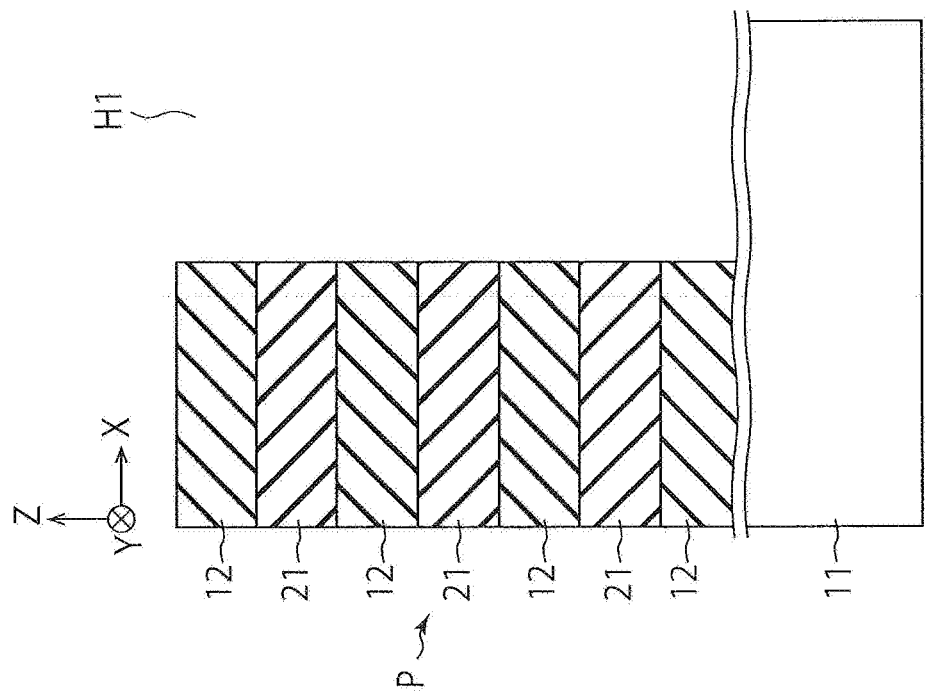

First, a plurality of insulators 12 and a plurality of sacrificial films 21 are alternately formed on the substrate 11 (FIG. 10A). As a result, the stacked film P including the insulators 12 and the sacrificial films 21 is formed on the substrate 11. These insulators 12 and sacrificial films 21 are formed by, for example, CVD such as ALD. Each sacrificial film 21 is, for example, a SiN film. Each sacrificial film 21 is an example of a fourth film.

Next, the memory hole H1 is formed in the stacked film P by lithography and RIE (Reactive Ion Etching) (FIG. 10B). The memory hole H1 has, for example, a circular shape in a plan view. The memory hole H1 is an example of a hole.

Figure 11A:
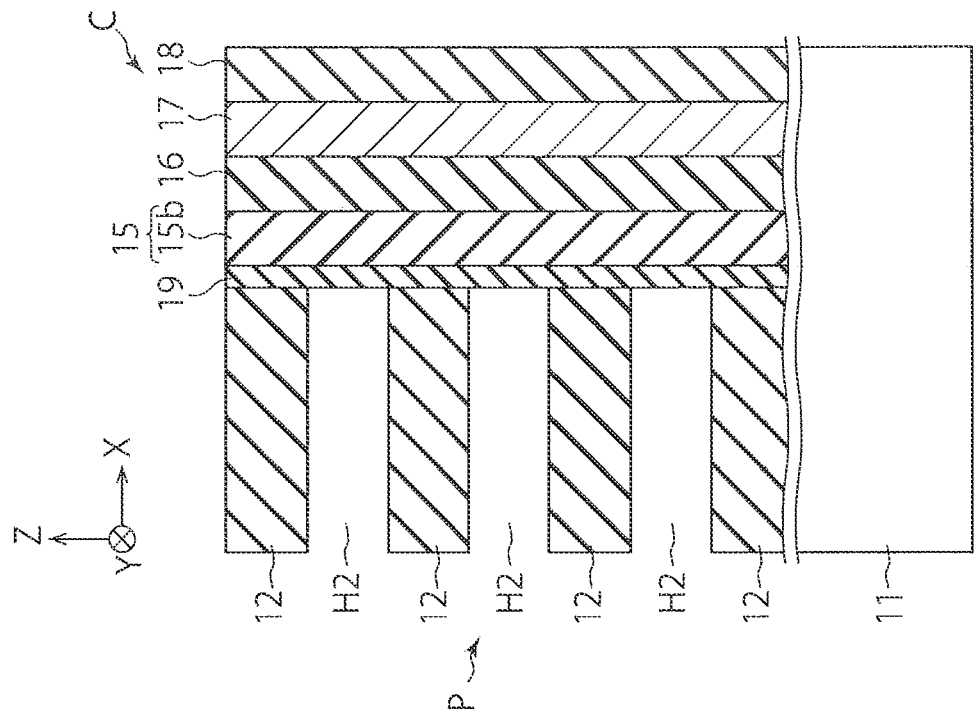

Next, the insulator 19, the inner peripheral film 15b, the tunnel insulator 16, the channel semiconductor layer 17, and the core insulator 18 are sequentially formed in the memory hole H1 (FIG. 11A). As a result, the insulator 19 is formed on the side face of the stacked film P in the memory hole H1, and a columnar portion C including an inner peripheral film 15b, a tunnel insulator 16, a channel semiconductor layer 17, and a core insulator 18 is formed on the side face of the insulator 19 in the memory hole H1. The insulator 19, the inner peripheral film 15b, the tunnel insulator 16, the channel semiconductor layer 17, and the core insulator 18 are formed by, for example, CVD such as ALD.

Figure 11B:
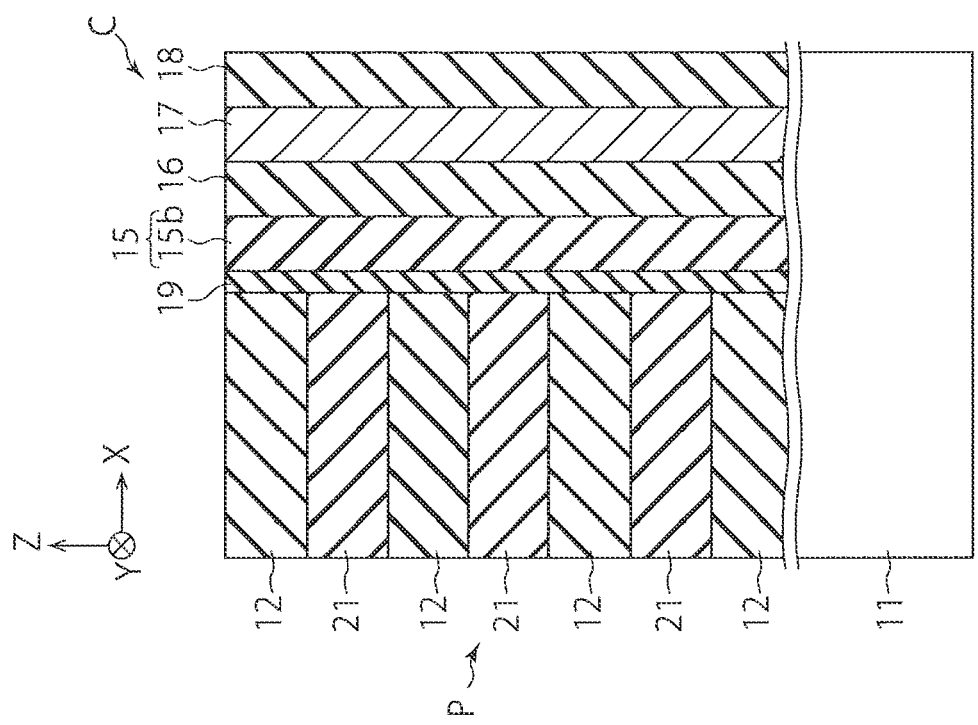

Next, slits (not shown) are formed in the stacked film P, and each sacrificial film 21 are removed by wet etching from each slit (FIG. 11B). As a result, a plurality of concave portions H2 are formed in the stacked film P. In this wet etching, the insulator 19 is used as an etching stopper. Therefore, the side face of the insulator 19 is exposed on the side face of these concave portions H2.

Figure 12B:
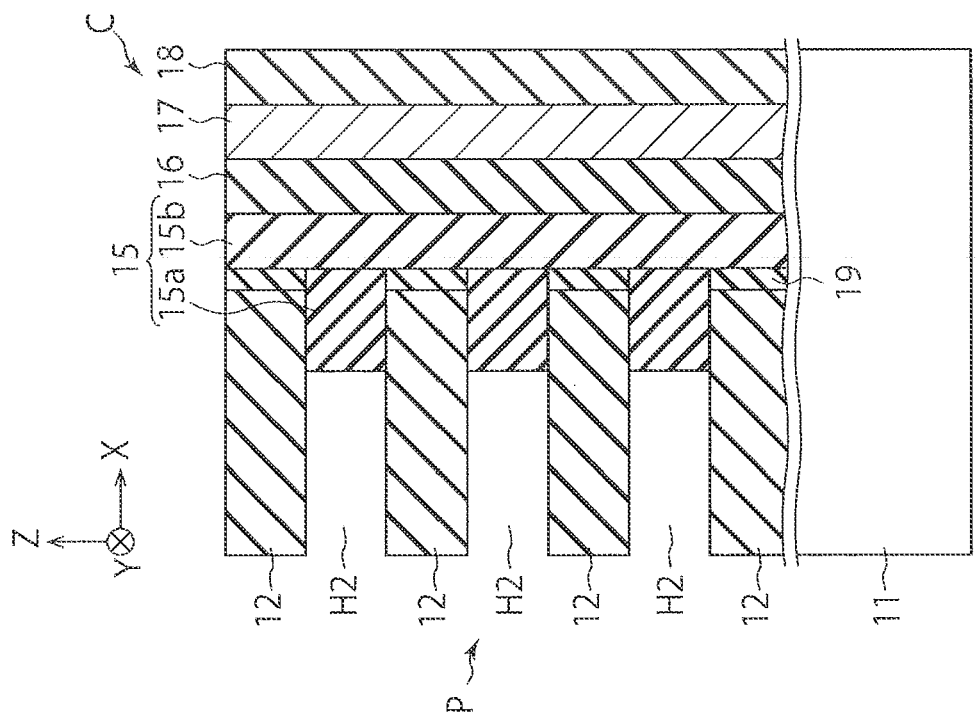
Figure 12A:
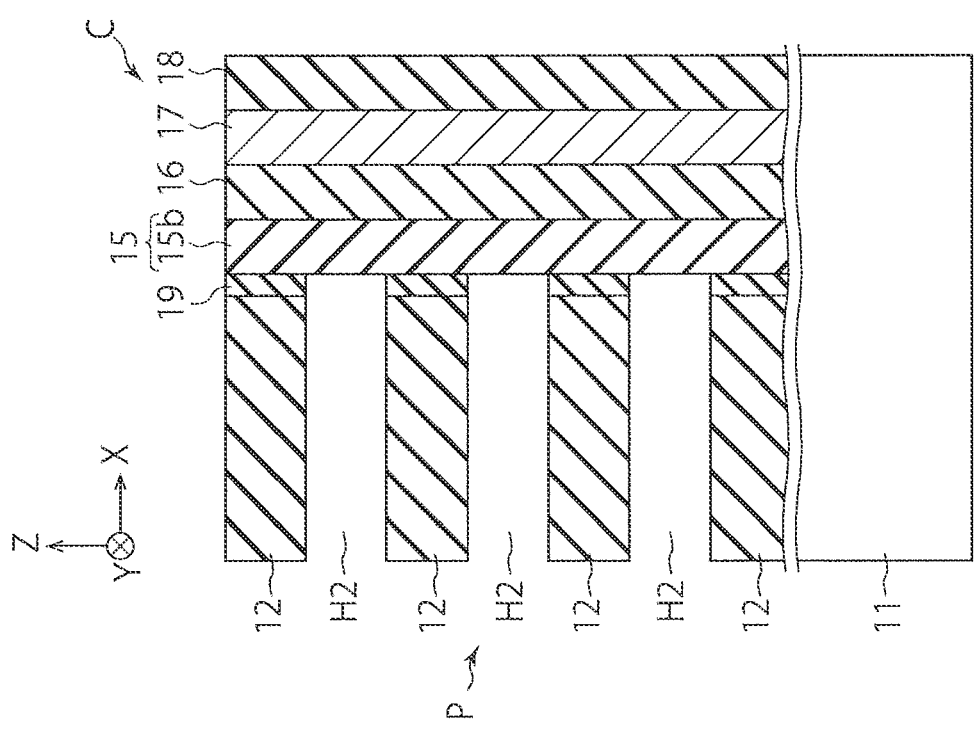

Next, the insulator 19 exposed in these concave portions H2 is etched by wet etching from these concave portions H2 (FIG. 12A). As a result, the insulator 19 near each concave portion H2 is removed, and the side face of the inner peripheral film 15b is exposed in each concave portion H2. Further, the insulator 19 is divided into a plurality of portions as in the case of the plurality of insulators 19 shown in FIG. 9. This wet etching is performed using, for example, a dHF aqueous solution. This dHF aqueous solution is an example of the substance including a halogen. The step of FIG. 12A for etching the insulator 19 is performed in the same manner as the step of FIG. 18 for removing the natural oxide film 4.

The step of FIG. 12A also etches the surfaces of the insulators 12 and the inner peripheral film 15b exposed in the concave portions H2, and also removes a portion of the insulators 12 and the inner peripheral film 15b. Further, F atoms derived from the dHF aqueous solution are added to the surfaces of the insulators 12 and the inner peripheral film 15b. At this time, the concentration of F atoms on the surface of the inner peripheral film 15b (SiN film) is higher than the concentration of F atoms on the surfaces of the insulators 12 ($SiO_2$ films) for the above-described reason.

Next, an outer peripheral film 15a is formed on the side face of the inner peripheral film 15b exposed in each concave portion H2 (FIG. 12B). As a result, the charge storage film 15 including the inner peripheral film 15b and the plurality of outer peripheral films 15a is formed on the substrate 11. The present embodiment makes it possible to selectively form these outer peripheral films 15a on the surface (side face) of the inner peripheral film 15b for the same reason as the nitride films 5 and 6 of the first embodiment. In FIG. 12B, these outer peripheral films 15a are selectively formed on the surface of the inner peripheral film 15*b* among the surfaces of the insulators 12 and the inner peripheral film 15*b*. Further details of the step of FIG. 12B will be described later.

Figure 13B:
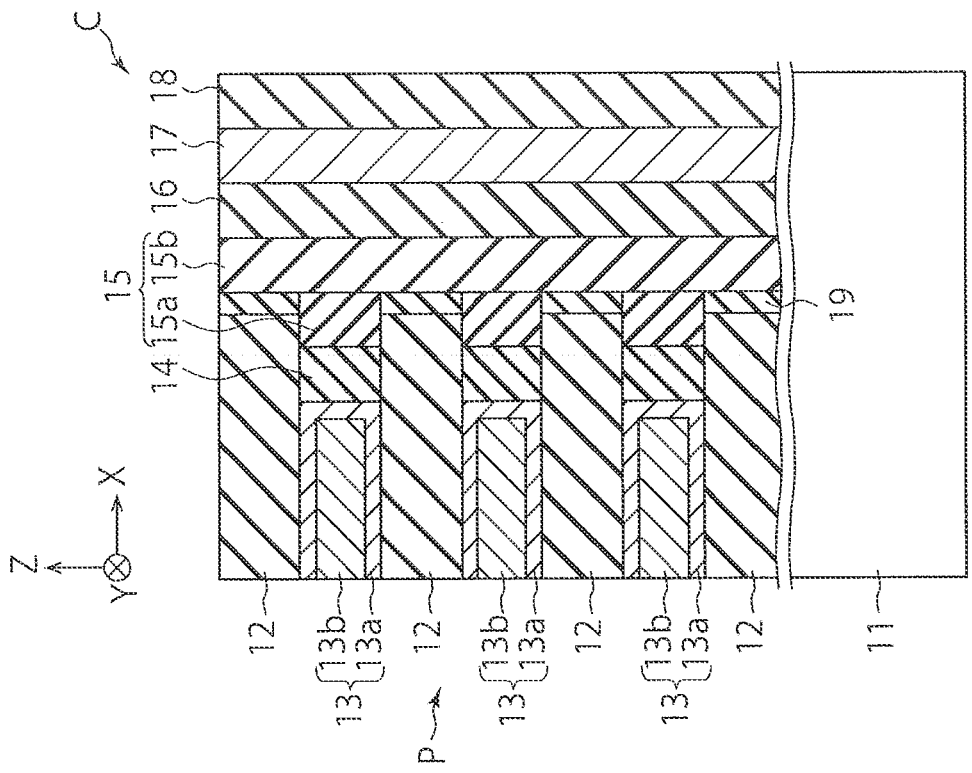
Figure 13A:
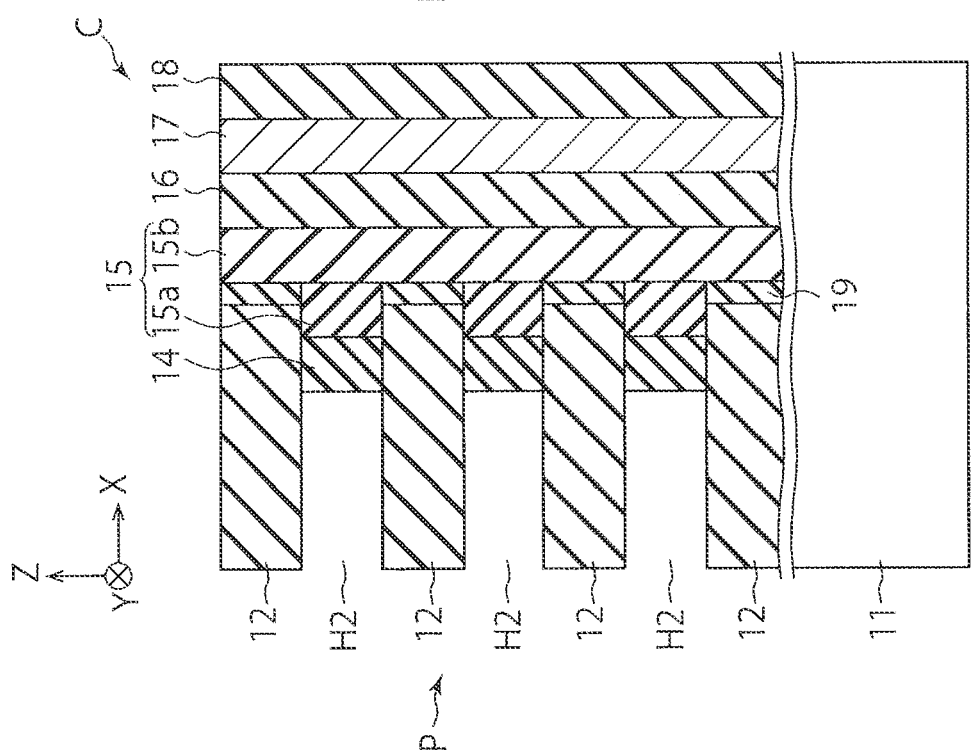

Next, the side face of each outer peripheral film 15*a* is oxidized from each concave portion H2 (FIG. 13A). As a result, a block insulator 14 is formed on the side face of each outer peripheral film 15*a*. In FIG. 13A, a plurality of outer peripheral films 15*a* and a plurality of block insulator 14 are sequentially formed on the side face of the inner peripheral film 15*b*.

Next, a barrier metal layers 13*a* and an electrode material layer 13*b* are sequentially formed in each concave portion H2 (FIG. 13B). As a result, an electrode layer 13 is formed in each concave portion H2. In FIG. 13B, a plurality of outer peripheral films 15*a*, a plurality of block insulators 14, and a plurality of electrode layers 13 are sequentially formed on the side faces of the inner peripheral film 15*b*. In this way, the plurality of sacrificial films 21 are replaced with the plurality of electrode layers 13 and the like (replacing step).

After that, various devices, interconnect layers, plugs, pads, inter layer dielectrics, etc. are formed on the substrate 11. In this way, the semiconductor device of the present embodiment is manufactured.

FIGS. 14A to 15B are cross-sectional views showing details of the method of manufacturing the semiconductor device of the second embodiment. FIGS. 14A to 15B show the details of the step of FIG. 12B. The processes of forming the outer peripheral film 15*a* in FIGS. 14A to 15B corresponds to the processes of forming the nitride films 5 and 6 in FIGS. 5A to 6C.

Figure 14A:
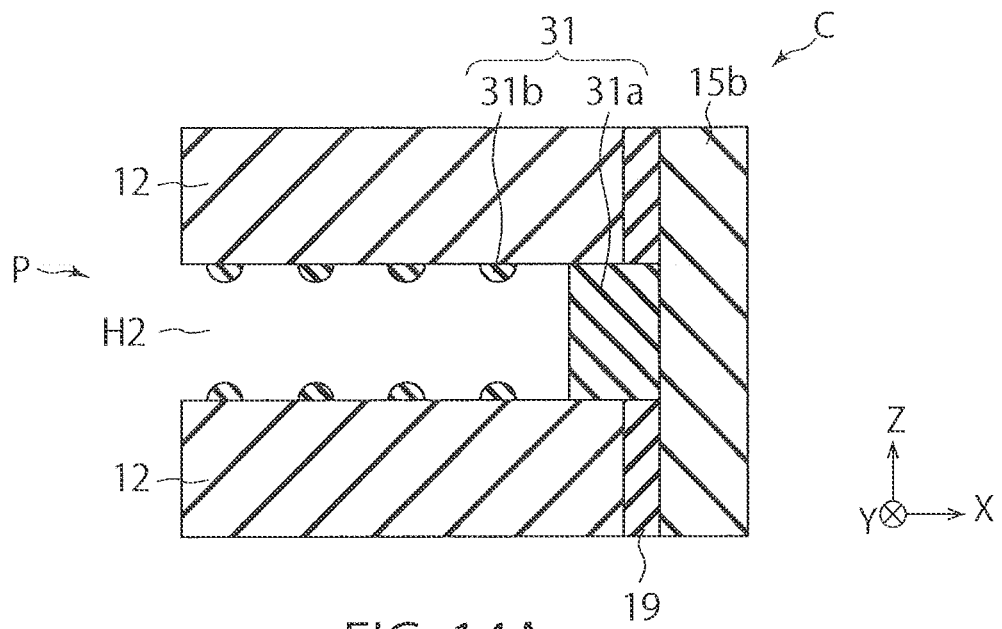
FIGS. 14A to 15B are cross-sectional views showing details of the method of manufacturing the semiconductor device of the second embodiment.

First, a nitride film 31 for the outer peripheral film 15*a* is formed on the entire surface of the substrate 11 (FIG. 14A). As a result, the nitride film 31 is formed on the surface of the inner peripheral film 15*b*, and further, the nitride film 31 begins to be formed on the surface of the insulator 12. The nitride film 31 shown in FIG. 14A includes a portion 31*a* formed on the surface of the inner peripheral film 15*b* and a portion 31*b* formed on the surface of the insulator 12. The step of FIG. 14A ends when the portion 31*b* begins to be formed. Hereinafter, the step of FIG. 14A is also referred to as a "forming process". This forming process is an example of the first process.

The nitride film 31 is, for example, a SiN film. The nitride film 31 may further include atoms other than Si and N. The nitride film 31 is formed by, for example, CVD such as ALD. The nitride film 31 of the present embodiment is formed by using, for example, $SiH_2Cl_2$ gas, which is a Si source gas, and $NH_3$ gas, which is an N source gas. The nitride film 31 and the nitride film 32 described later are examples of the third film and the second portion.

Figure 14B:
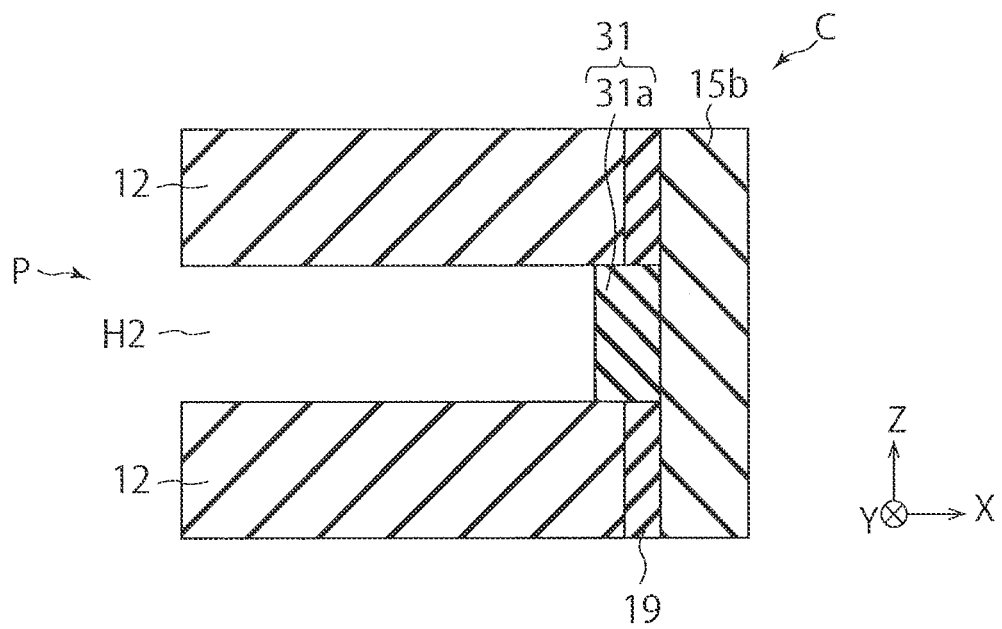

Next, a portion of the nitride film 31 is removed by wet etching (FIG. 14B). This wet etching is performed using, for example, a dHF aqueous solution. This dHF aqueous solution is an example of the substance including a halogen. Hereinafter, the step of FIG. 14B is also referred to as "etching process". This etching process is an example of the second process.

In the step of FIG. 14B, the portion 31*b* of the nitride film 31 is removed, and the portion 31*a* of the nitride film 31 is also partially removed. As a result, the surfaces of the insulator 12 and the portion 31*a* are also etched, and a portion of the insulator 12 and the portion 31*a* is also removed. Further, F atoms derived from the dHF aqueous solution are added to the surfaces of the insulator 12 and the portion 31*a*. At this time, the concentration of F atoms on the surface of the portion 31*a* is higher than the concentration of F atoms on the surface of the insulator 12 for the above-described reason.

According to the present embodiment, performing the forming process and etching process makes it possible to selectively form the nitride film 31 (portion 31*a*) on the surface of the inner peripheral film 15*b*. However, the thickness of the nitride film 31 formed by the forming process and etching process is about the same as the thickness of the nitride film formed in the steps of FIGS. 2B and 2C. Therefore, in the present embodiment, the forming processes and etching processes are alternately repeated. This makes it possible to selectively form a nitride film having a thick thickness on the surface of the inner peripheral film 15*b*. The thickness of the nitride film 31 shown in FIG. 14B is, for example, less than 4 nm.

Figure 15A:
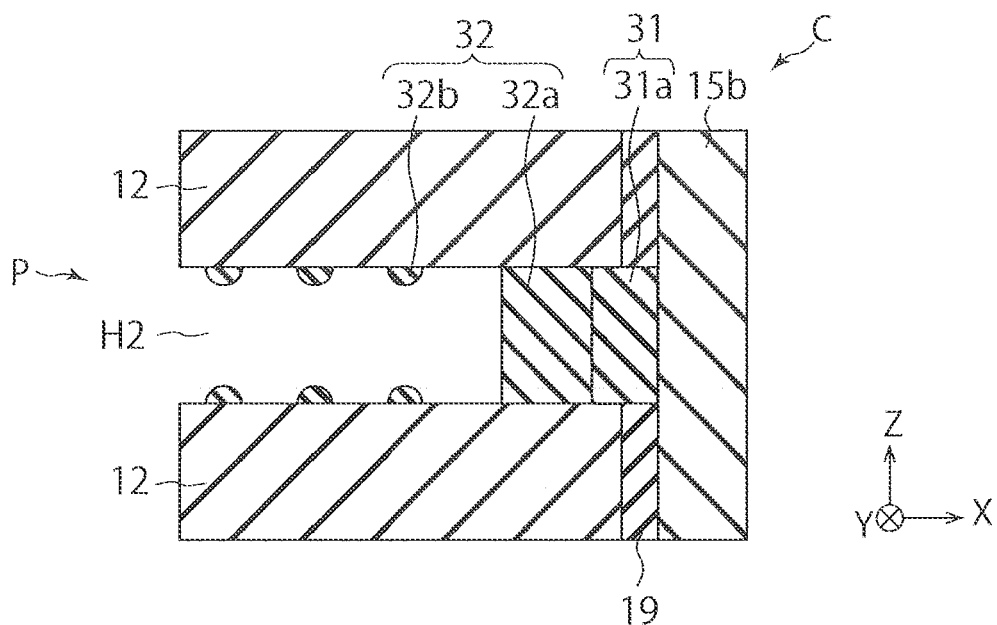

Next, a nitride film 32 for the outer peripheral film 15*a* is formed on the entire surface of the substrate 1 (FIG. 15A). As a result, the nitride film 32 is formed on the surface of the nitride film 31, and further, the nitride film 32 begins to be formed on the surface of the insulator 12. The nitride film 32 shown in FIG. 15A includes a portion 32*a* formed on the surface of the nitride film 31 and a portion 32*b* formed on the surface of the insulator 12. The step of FIG. 15A ends when the portion 32*b* begins to be formed. Whereas the step of FIG. 14A is the "first forming process", the step of FIG. 15A is the "second forming process".

The details of the nitride film 32 are the same as those of the nitride film 31. The nitride film 32 is, for example, a SiN film. The nitride film 32 may further include atoms other than Si and N. The nitride film 32 is formed by, for example, CVD such as ALD. The nitride film 32 of the present embodiment is formed by using, for example, $SiH_2Cl_2$ gas, which is a Si source gas, and $NH_3$ gas, which is an N source gas. The nitride film 32 and the above nitride film 31 are examples of the third film and the second portion.

Figure 15B:
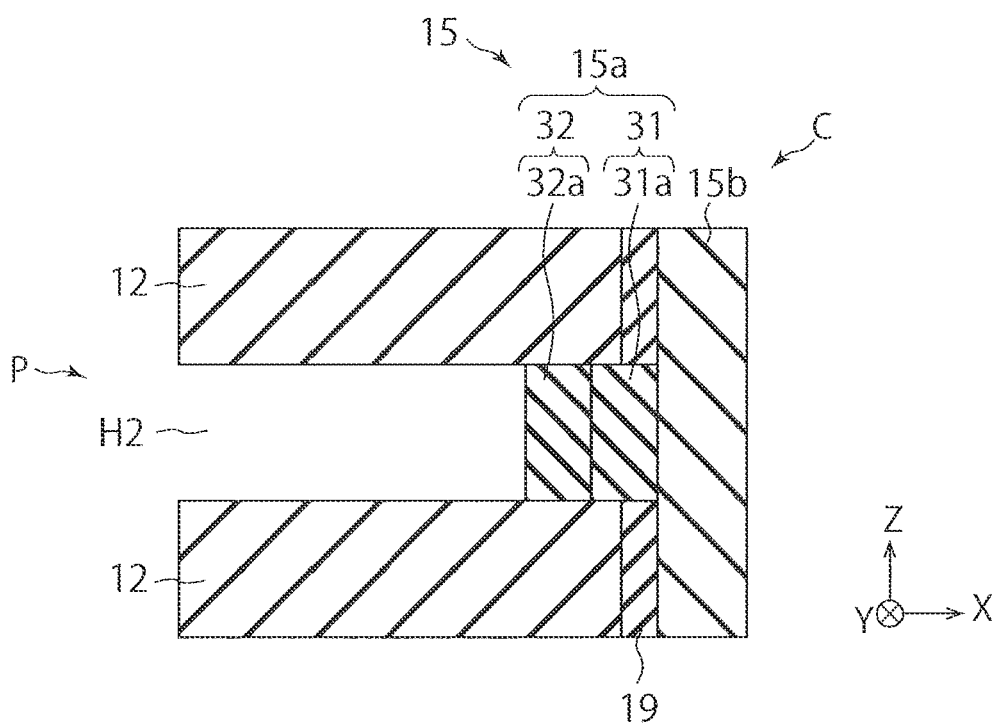

Next, a portion of the nitride film 32 is removed by wet etching (FIG. 15B). This wet etching is performed using, for example, a dHF aqueous solution. This dHF aqueous solution is an example of the substance including a halogen. Whereas the step of FIG. 14B is the "first etching process", the step of FIG. 15B is the "second etching process".

In the step of FIG. 15B, the portion 32*b* of the nitride film 32 is removed, and the portion 32*a* of the nitride film 32 is also partially removed. As a result, the surfaces of the insulator 12 and the portion 32*a* are also etched, and a portion of the insulator 12 and the portion 32*a* is also removed. Further, F atoms derived from the dHF aqueous solution are added to the surfaces of the insulator 12 and the portion 32*a*. At this time, the concentration of F atoms on the surface of the portion 32*a* is higher than the concentration of F atoms on the surface of the insulator 12 for the above-described reason.

According to the present embodiment, alternately repeating the forming processes and etching processes makes it possible to selectively form nitride films 31 and 32 (portions 31*a* and 32*a*) having a thick thickness on the surface of the inner peripheral film 15*b*. In the present embodiment, two forming processes and the two etching processes are alternately performed, but three or more forming processes and three or more etching processes may be alternately performed. This makes it possible to selectively form a nitride film having a thicker thickness on the surface of the inner peripheral film 15*b*. The total thickness of the nitride films 31 and 32 shown in FIG. 15B, that is, the thickness of the outer peripheral film 15*a* is, for example, 4 nm or more.

What is described on the forming processes and the etching processes of the first embodiment is also applicable to the forming processes and the etching processes of the present embodiment. Further, what is described on the etching processes of the first embodiment is applicable to the etching in the step of FIG. 12A of the present embodiment as well as the etching in the step of FIG. 1C of the first embodiment.

Figure 16:
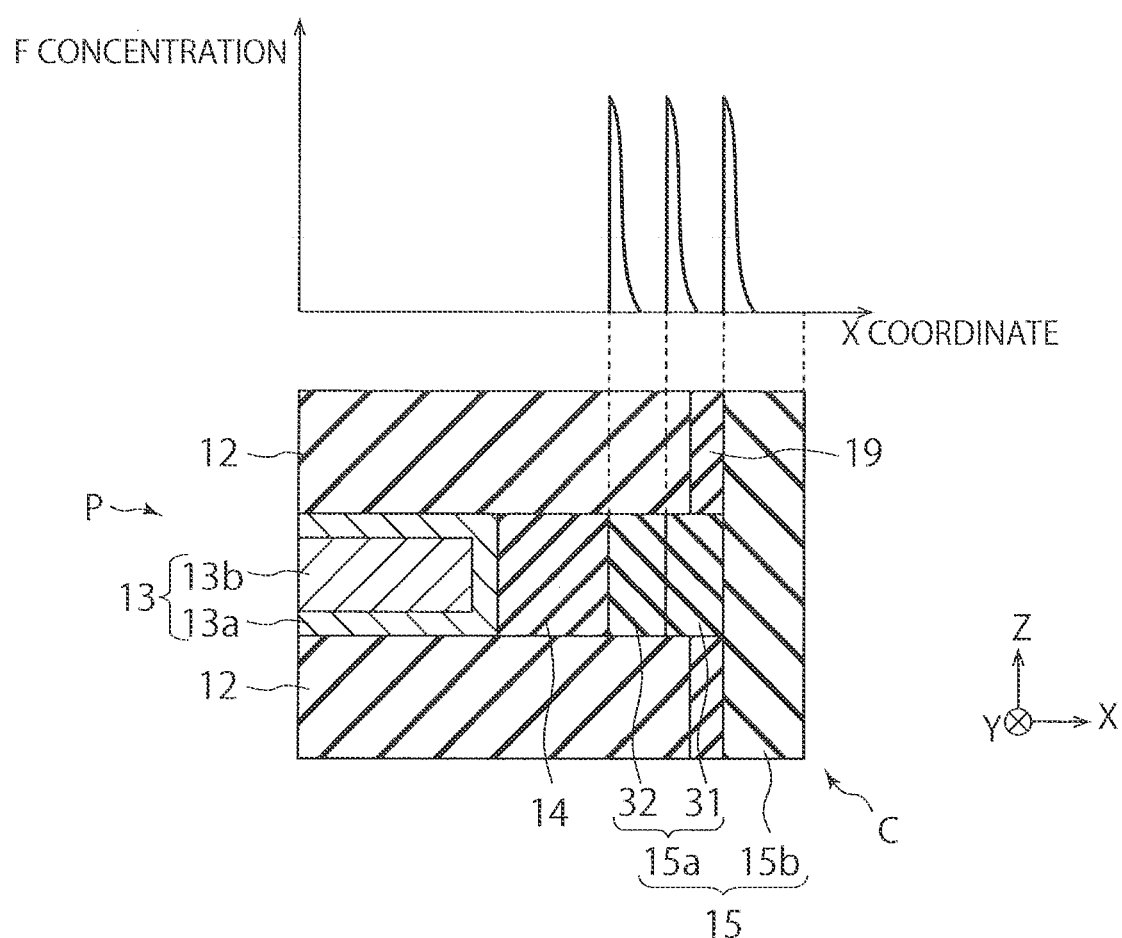
FIG. 16 is a graph and a cross-sectional view for explaining the method of manufacturing the semiconductor device of the second embodiment.

FIG. 16 is a graph and a cross-sectional view for explaining the method of manufacturing the semiconductor device of the first embodiment.

The cross-sectional view of FIG. 16 shows the same cross section as the cross section shown in FIGS. 9 and 13B. The graph of FIG. 16 shows the F concentration distribution in the X direction in the charge storage film 15. The X direction shown in FIG. 16 corresponds to the thickness direction of the charge storage film 15, that is, the radiation direction of the columnar portion C. The X direction shown in FIG. 16 is an example of the first direction. On the other hand, the Z direction shown in FIG. 16 corresponds to the stacking direction of the stacked film P.

As described above, the step of FIG. 12A, the step of FIG. 14B, and the step of FIG. 15B are performed using the dHF aqueous solution. In these steps, F atoms derived from the dHF aqueous solution are added to the surfaces and the inside of the inner peripheral film 15b, the nitride film 31, and the nitride film 32. As a result, the F concentration distribution in the X direction in the inner peripheral film 15b, the nitride film 31, and the nitride film 32 has a plurality of concentration peaks as shown in FIG. 16. These concentration peaks are formed near the surface of the inner peripheral film 15b, near the surface of the nitride film 31, and near the surface of the nitride film 32. When the forming processes and etching processes are repeated M times (M is an integer of 2 or more), M+1 concentration peaks appear as these.

As described above, the present embodiment makes it possible to selectively form the outer peripheral films 15a as in the nitride films 5 and 6 of the first embodiment. Specifically, the present embodiment makes it possible to selectively form the outer peripheral films 15a on the surface of the inner peripheral film 15b among the surfaces of the insulator 12 and the inner peripheral film 15b.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, the method comprising:
   forming a stacked film alternately including a plurality of insulators and a plurality of fourth films;
   forming a hole in the stacked film;
   forming a first portion of a charge storage film and a semiconductor layer in the hole;
   removing the plurality of fourth films to form a plurality of concave portions in the stacked film;
   etching surfaces of the plurality of insulators and the first portion from the plurality of concave portions using a substance including a halogen; and
   forming a plurality of second portions of the charge storage film and a plurality of electrode layers in the plurality of concave portions,
   wherein:
   the insulators include oxygen,
   the first portion and the second portions include nitrogen, and
   the second portions are formed by alternately performing first processes and second processes, each of the first processes forming a portion of the second portions, and each of the second processes etching a portion of the second portions using a substance including a halogen.

2. The method of claim 1, wherein the second portions are selectively formed on the surface of the first portion among the surfaces of the insulators and the first portion by alternately performing the first processes and the second processes.

3. The method of claim 1, wherein the plurality of insulators include silicon and oxygen, and the first portion and the second portions include silicon and nitrogen.

4. The method of claim 1, wherein the first processes are performed using a first gas including silicon and a second gas including nitrogen.

5. The method of claim 4, wherein the first gas includes an inorganic compound.

6. The method of claim 4, wherein the first gas includes $SiH_4$, $SiH_3Cl$, $SiH_2Cl_2$ or $SiHCl_3$, where Si represents silicon, H represents hydrogen, and Cl represents chlorine.

7. The method of claim 4, wherein the second gas includes a nitriding agent.

8. The method of claim 4, wherein the second gas includes $NH_3$ or $N_2H_4$, where N represents nitrogen, and H represents hydrogen.

9. The method of claim 1, wherein the first processes are performed at 50 Pa or less.

10. The method of claim 1, wherein the second processes are performed so that the halogen is added to the second portions.

11. The method of claim 1, wherein the second processes are performed using a liquid including the halogen.

12. The method of claim 1, wherein the second processes are performed using a substance including F (fluorine), Cl (chlorine), Br (bromine) or I (iodine).

13. The method of claim 1, wherein the second processes are performed using $F_2$, HF, $NF_3$, $SiF_4$ or ClF, where F represents fluorine, H represents hydrogen, N represents nitrogen, Si represents silicon, and Cl represents chlorine.

14. The method of claim 1, wherein the second portions are formed so that a halogen concentration distribution in a first direction in each of the second portions has a plurality of concentration peaks.

15. The method of claim 14, wherein the first direction is a thickness direction of the second portions.

* * * * *